United States Patent
Seberger et al.

(10) Patent No.: US 10,749,373 B2
(45) Date of Patent: Aug. 18, 2020

(54) SYSTEMS AND METHODS FOR SITUATION-DEPENDENT SUPERCAPACITOR VOLTAGE CONTROL

(71) Applicant: FISHER CONTROLS INTERNATIONAL LLC, Marshalltown, IA (US)

(72) Inventors: Stephen G. Seberger, Marshalltown, IA (US); Scott E. Losing, Legrand, IA (US); Zachary M. Bryant, Marshalltown, IA (US)

(73) Assignee: FISHER CONTROLS INTERNATIONAL LLC, Marshalltown, IA (US)

(*) Notice: Subject to any disclaimer, the term of this patent is extended or adjusted under 35 U.S.C. 154(b) by 0 days.

(21) Appl. No.: 16/136,917

(22) Filed: Sep. 20, 2018

(65) Prior Publication Data

US 2019/0103755 A1    Apr. 4, 2019

Related U.S. Application Data

(60) Provisional application No. 62/566,168, filed on Sep. 29, 2017.

(51) Int. Cl.
*H01M 10/44* (2006.01)
*H01M 10/46* (2006.01)
(Continued)

(52) U.S. Cl.
CPC ............... *H02J 7/345* (2013.01); *G01K 7/22* (2013.01); *G01R 19/16528* (2013.01);
(Continued)

(58) Field of Classification Search
CPC ........ H02J 7/007; H02J 7/0072; H02J 7/0091; H02J 7/027; H02J 7/047; H02J 7/345
(Continued)

(56) References Cited

U.S. PATENT DOCUMENTS

| 6,066,936 A | 5/2000 | Okamura et al. |
| 9,013,144 B2 * | 4/2015 | Cooley ............ H01G 11/58 320/112 |

(Continued)

FOREIGN PATENT DOCUMENTS

EP    259527 A1    5/2013

OTHER PUBLICATIONS

"High Current Supercapacitor Backup Controller and System Monitor", Linear Technology Corporation, LTC3350, 1-46 (2014).
(Continued)

*Primary Examiner* — Edward Tso
(74) *Attorney, Agent, or Firm* — Marshall, Gerstein & Borun LLP

(57) ABSTRACT

A system and method are provided for operating, in a process control system, a circuit coupled to an input power supply and a supercapacitor susceptible to damage at high temperatures. A controller causes the circuit to supply electric charge from the input power supply to the supercapacitor. The controller also causes the circuit to supply electric power from the supercapacitor to a field device, such as an actuator. The controller selects a voltage to which the supercapacitor is to be charged based at least in part on a detected temperature associated with the supercapacitor, and causes the circuit to supply electric charge from the input power supply to the supercapacitor based on the selected voltage.

24 Claims, 3 Drawing Sheets

(51) Int. Cl.
  *H02J 7/34*    (2006.01)
  *H02J 7/00*    (2006.01)
  *H02J 9/06*    (2006.01)
  *G01K 7/22*    (2006.01)
  *G01R 19/165*  (2006.01)
  *H02J 1/10*    (2006.01)
  *H02J 7/35*    (2006.01)

(52) U.S. Cl.
  CPC ............ *H02J 1/10* (2013.01); *H02J 7/007* (2013.01); *H02J 7/0091* (2013.01); *H02J 7/35* (2013.01); *H02J 9/06* (2013.01); *H02J 9/061* (2013.01); *H02J 9/068* (2020.01)

(58) Field of Classification Search
  USPC ....... 320/125, 132, 137, 150, 152, 153, 166, 320/167
  See application file for complete search history.

(56) References Cited

U.S. PATENT DOCUMENTS

| | | |
|---|---|---|
| 2003/0222505 A1 | 12/2003 | Randall |
| 2008/0150484 A1 | 6/2008 | Kimball et al. |
| 2017/0222451 A1 | 8/2017 | Peng |
| 2019/0245367 A1* | 8/2019 | Bommer ............. H01M 10/443 |

OTHER PUBLICATIONS

Rotork, "Rotork: CVA Electronic Process Control Actuator Fail to Position". Retrieved from the Internet at: <URL:http://www.rotork.com/en/product/index/failtoposition> (2017).
International Search Report for PCT/US2018/052912, dated Dec. 6, 2018.
Written Opinion for PCT/US2018/052912, dated Dec. 6, 2018.

* cited by examiner

SYSTEMS AND METHODS FOR SITUATION-DEPENDENT SUPERCAPACITOR VOLTAGE CONTROL

REFERENCE TO RELATED APPLICATION

This application claims priority to provisional U.S. application Ser. No. 62/566,168 filed on Sep. 29, 2017, the entire disclosure of which is hereby expressly incorporated by reference herein.

FIELD OF DISCLOSURE

This application generally relates to operating, in a process control system, a circuit coupled to an input power supply and a supercapacitor susceptible to damage at high temperatures.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Process control systems, like those used in chemical, petroleum, industrial or other process plants to manufacture, refine, transform, generate, or produce physical materials or products, typically include one or more process controllers communicatively coupled to one or more field devices via analog, digital or combined analog/digital buses, or via a wireless communication link or network. The field devices, which may be, for example, valves, valve positioners, actuators, switches and transmitters (e.g., temperature, pressure, level and flow rate sensors), are located within the process environment and generally perform physical or process control functions such as opening or closing valves, measuring process parameters such as pressure, temperature, etc., and the like to control one or more process executing within the process plant or system.

Smart field devices, such as the field devices conforming to the well-known Fieldbus protocol, may also perform control calculations, alarming functions, and other control functions commonly implemented within the controller. The process controllers, which are also typically located within the plant environment, receive signals indicative of process measurements made by the field devices and/or other information pertaining to the field devices and execute a controller application that runs, for example, different control modules which make process control decisions, generate control signals based on the received information and coordinate with the control modules or blocks being performed in the field devices, such as HART®, WirelessHART®, and FOUNDATION® Fieldbus field devices. The control modules in the controller send the control signals over the communication lines or links to the field devices to thereby control the operation of at least a portion of the process plant or system, e.g., to control at least a portion of one or more industrial processes running or executing within the plant or system. I/O devices, which are also typically located within the plant environment, typically are disposed between a controller and one or more field devices, and enable communications there between, e.g. by converting electrical signals into digital values and vice versa. Field devices, controllers, and I/O devices are generally located, disposed, or installed in a field environment of a process control system or plant.

Supercapacitors may be utilized in process control systems for a variety of purposes such as to provide backup power for field devices during a power outage or power shortage. That is, the input power supply used to power the field devices may be a variable power supply, such as a solar panel, and may sometimes fail to provide power. When the input power supply is functioning properly, the input power supply will supply power to field devices and will also supply power to the supercapacitor. Accordingly, the supercapacitor may be charged, e.g., to a particular voltage required to power the corresponding field device, while the input power supply is available. Then, when the input power supply no longer provides sufficient power, the supercapacitor may be discharged in order to power the field device. For example, upon loss of power, the supercapacitor may supply power to an actuator to drive a valve into a preconfigured "safe" position during a power outage and/or power shortage. In this way, the safety of the process control system may be maintained even during power outages and/or power shortages. More generally, supercapacitors may be used in process control systems as back-up storage devices or primary power storage devices, in a variety of applications.

Upon aging, which involves chemical degradation, a supercapacitor can no longer provide backup power to a field device in a process control system. Generally speaking, supercapacitors age more quickly when operating at high temperatures. However, in many instances, devices in process control systems must operate at relatively high ambient temperatures.

SUMMARY

In one aspect, a method of operating a circuit coupled to an input power supply and a supercapacitor susceptible to damage at high temperatures is provided. The method includes detecting, by processing hardware, a temperature associated with the supercapacitor; selecting, by the processing hardware, a voltage to which the supercapacitor is to be charged based at least in part on the detected temperature; and causing, by processing hardware, the circuit to supply electric charge from the input power supply to the supercapacitor based on the selected voltage.

In another aspect, a method of operating a circuit coupled to an input power supply and a supercapacitor susceptible to damage at high temperatures is provided. The method includes causing, by processing hardware, the circuit to supply electric charge from the input power supply to the supercapacitor, during a first period of time; detecting, by processing hardware, an increase in a temperature associated with the supercapacitor; and causing, by the processing hardware, the circuit to decrease a voltage to which the supercapacitor is charged based at least in part on the detected increase in the temperature, during a second period of time.

In still another aspect, a system is provided including an input power supply; a supercapacitor; a field device; a circuit coupled to the input power supply, the supercapacitor, and the field device; and a controller. The controller is configured to cause the circuit to supply electric charge from the input power supply to the supercapacitor; and cause the circuit to decrease a voltage to which the supercapacitor is charged based at least in part on an increase in a temperature associated with the supercapacitor.

DETAILED DESCRIPTION

Figure 1:
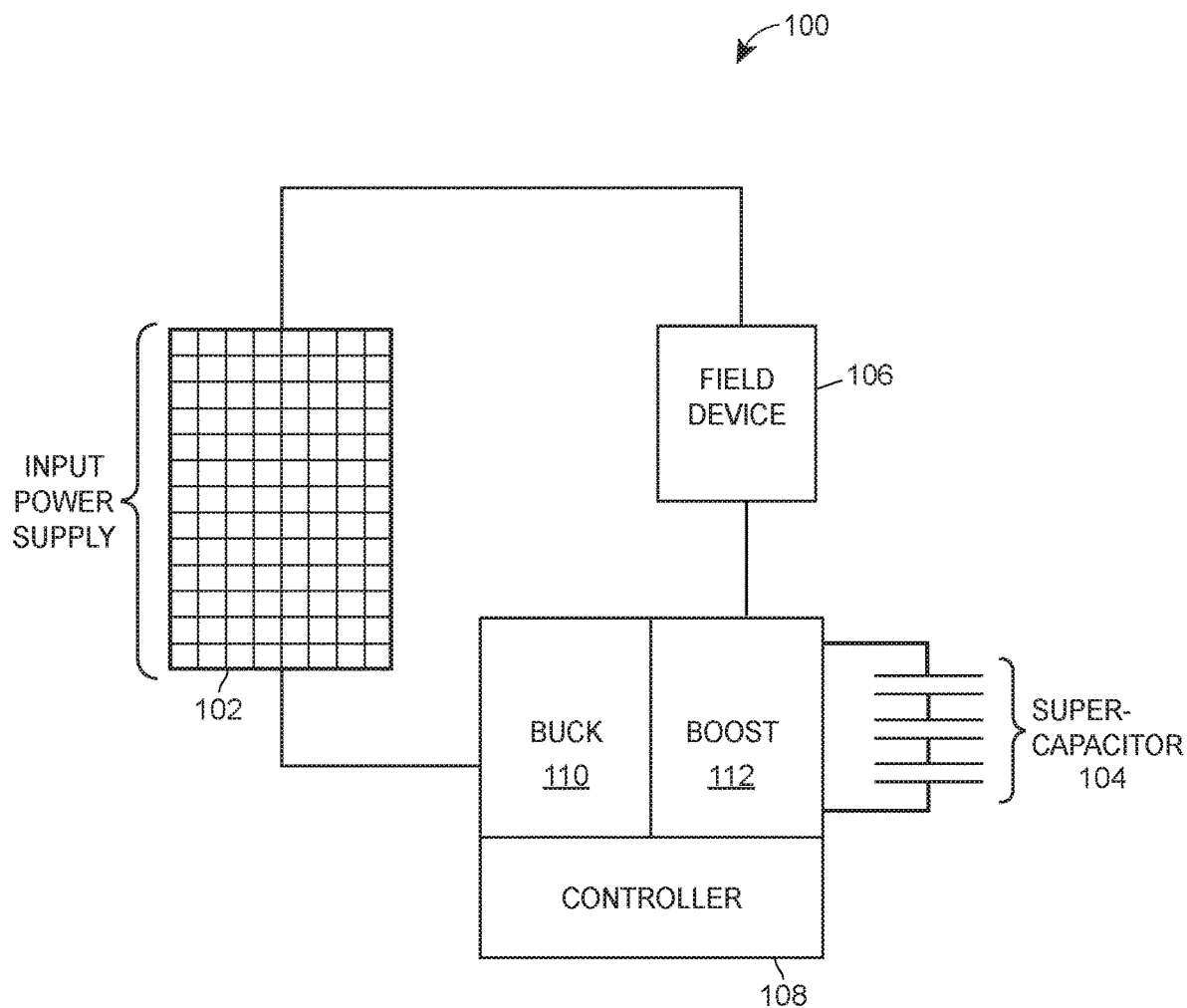
FIG. 1 is a circuit diagram of an example circuit coupled to an input power supply, a supercapacitor susceptible to damage at high temperatures, and a field device.

As discussed above, supercapacitors age more quickly when operating at higher temperatures. However, in many instances, devices in process control systems operate at high ambient temperatures and/or heat up during operation. One way to reduce the effect of high temperature on the aging of a supercapacitor is to reduce the voltage to which the supercapacitor is charged. However, the supercapacitor must maintain sufficient charge to provide backup power to the field devices of the process control system, which may require additional power at lower temperatures.

The systems and methods of this disclosure automatically control the voltage to which a supercapacitor is charged based at least in part on the temperature of the supercapacitor. For example, a controller can automatically decrease the voltage to which a supercapacitor is charged at higher temperatures and increase the voltage to which the supercapacitor is charged at lower temperatures. Decreasing the voltage to which a supercapacitor is charged while it is operating at a high temperature will reduce the effect that the high temperature has on the aging of the supercapacitor. Accordingly, the useful life of a supercapacitor in a process control system may be extended. Additionally, increasing the voltage to which the supercapacitor is charged while it is operating at a lower temperature will ensure that the supercapacitor can provide sufficient backup power to field devices in the process control system.

Initially, the temperature of the supercapacitor may be determined, and, based at least partially on the temperature, the controller can determine an appropriate target voltage for the supercapacitor. The controller to this end can use a look-up table, a linear function that specifies a proportional relationship between temperature and voltage, a non-linear function that specifies a more complex relationship between temperature and voltage, or any other suitable algorithm. The controller may repeat the check and, in some cases, adjustment periodically (e.g., every minute, every ten minutes, hourly). Generally speaking, the algorithm the controller uses may output higher target voltages at lower temperatures and lower target voltages at higher temperatures. However, the relationship between the temperature and the target voltage may not be strictly linear. That is, in some instances, the algorithm may involve hysteresis, and consequently, a particular increase or decrease in temperature may not cause any change to the target voltage.

Accordingly, the controller can use another algorithm to determine if either charging or discharging is needed to reach the target voltage. Generally speaking, charging is needed when the voltage on the supercapacitor is too low, and discharging is needed when the voltage on the supercapacitor is too high. However, this algorithm may also involve hysteresis, and consequently, in some instances, a particular difference between the present voltage and the target voltage may not cause any charging or discharging of the capacitors. When the algorithm determines that input power is available and charging is needed, the controller may cause the capacitors to be charged to the target voltage. When the algorithm determines that discharging is needed, the controller may cause the capacitors to be discharged to the target voltage. The controller may repeat this process periodically (e.g., every ten minutes.)

Additionally, the controller may continuously (or nearly continuously) monitor the power supply. If input power fails, the controller may cause the power to be drawn from the supercapacitors to power field devices as needed, i.e., as a backup power source. The controller may be configured to carry out this process within a few milliseconds to prevent a restart of the field device before it has reached the preconfigured power fail state.

Turning now to the drawings, an example circuit 100, illustrated in FIG. 1 in a highly simplified manner, may include an input power supply 102, a supercapacitor 104 susceptible to damage at high temperatures, and a field device 106. A controller 108 may include an application-specific integrated circuit (ASIC) or a processing unit configured to execute instructions stored on a computer-readable memory. The controller 108 may monitor and control various aspects of operation of the supercapacitor 104 (or an array of such supercapacitors). For example, the controller 108 can control currents, and voltages associated with the supercapacitor 104. The controller 108 in one operational state causes the input power supply 102 to supply power to charge the supercapacitor 104 using the buck DC/DC converter 110 and, in another operational state, causes the boost DC/DC converter 112 to transfer power from the supercapacitor 104 to the field device 106 or to dissipate some of the power via a shunt circuit. For example, when the input power supply 102 fails to supply power to the field device 106, the controller 108 may cause the supercapacitor 104 to supply backup power to the field device 106. The converters 110 and 112 need not be provided as separate modules, and in some implementations can define a single buck-boost converter.

In some implementations, the housing of the controller 108 may also include a temperature sensor configured to detect the temperature of the supercapacitor 104. The temperature sensor can be a contact or non-contact sensor of any suitable type, e.g., a thermistor, a thermostat, or a thermocouple. In other implementations, the controller 108 receives a signal indicative of the temperature of the supercapacitor 104 from an external sensor, which can be positioned on or near the supercapacitor 104.

In yet other implementations, the controller 108 is configured to infer temperature of the supercapacitor 104 based on one or more operational parameters of the supercapacitor 104, the input power supply 102, and/or the field device 106, or of the process control system as a whole or of any of its component parts. For instance, an operator can test the conditions in which the supercapacitor 1-4 is expected to operate to determine a temperature or temperature range for a supercapacitor 104 under various operating conditions of the process control system. The results of the testing may be stored in the form of a profile in the memory of the controller 108. In operation, the controller 108 can determine, based on the stored profile, the probable temperature for the current set of conditions.

In an example implementation, several components of the circuit 100 are provided in a single integrated circuit such as LTC®3350 backup power controller manufactured by Linear Technology Corporation. In this implementation, the integrated circuit may provide temperature readings via a dedicated pin, for example, and another controller operating separately from the integrated circuit may implement some or all of the functionality for controlling the voltage of the supercapacitor 104 based at least on temperature. This implementation is discussed below with reference to FIG. 2.

In some instances, when the controller 108 (or another controller operating in the circuit 100) detects that the temperature of the supercapacitor 104 has increased, the controller 108 causes the circuit to decrease the voltage to which the supercapacitor 104 is charged. For example, the controller 108 may cause the circuit to operate a shunt component to remove excess charge from the supercapacitor until the voltage is sufficiently decreased. In this way, the useful life of the supercapacitor can be extended. Similarly, when the temperature of the supercapacitor 104 decreases, the controller 108 may cause the circuit to increase the voltage to which the supercapacitor 104 is charged. In this manner, the controller 108 can maximize the charging voltage at colder temperatures, when field devices 106 generally require greater power and when aging is less of a concern.

Figure 2:
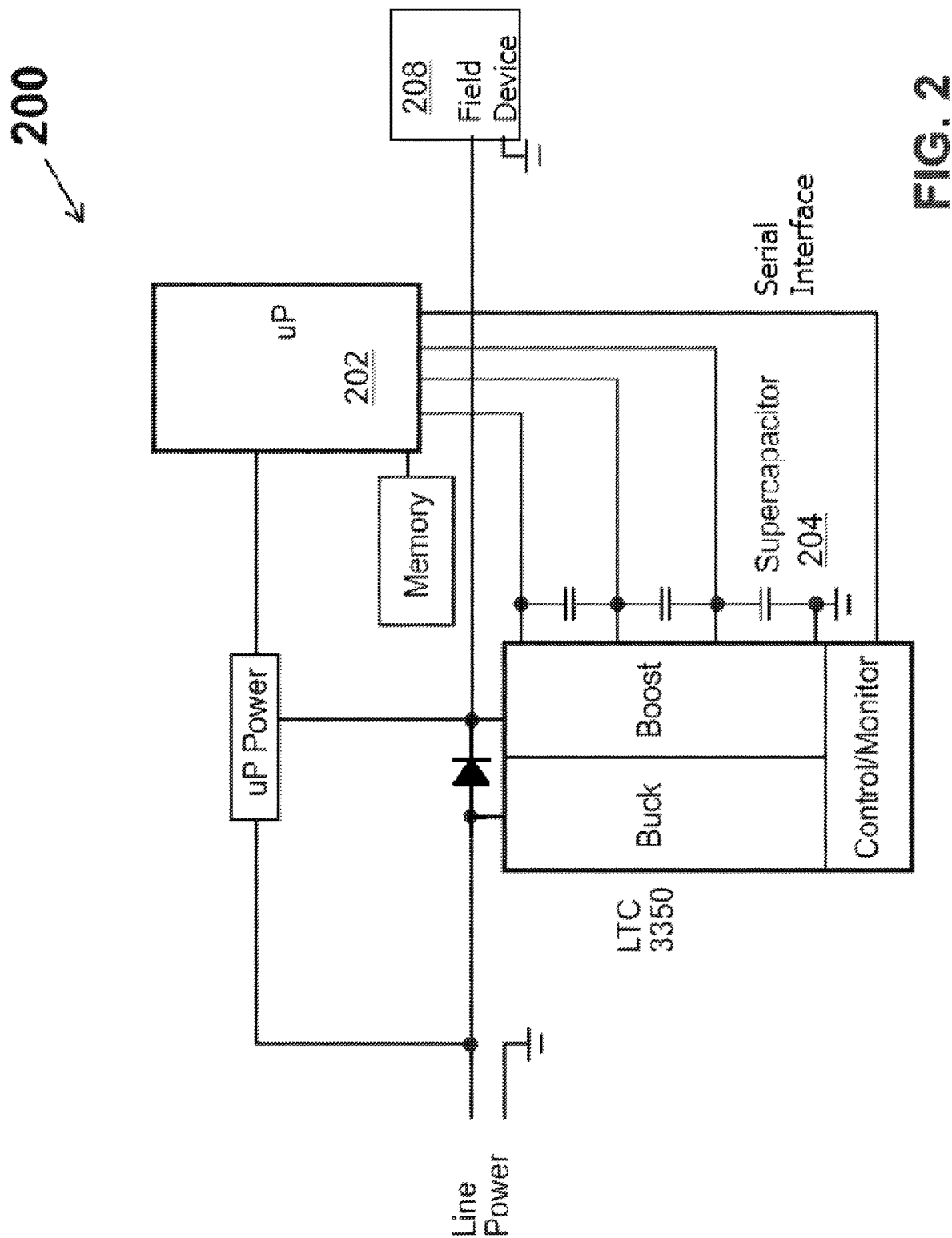
FIG. 2 is a circuit diagram of an example process control system incorporating a supercapacitor susceptible to damage at high temperatures.

FIG. 2 is a circuit diagram of an example process control system 200 incorporating a supercapacitor susceptible to damage at high temperatures. In this implementation, a controller 202 may control the charging and discharging of a supercapacitor 204 generally as discussed above in order to extend the useful life of the supercapacitor 204. In addition to temperature readings from the module LTC 3350, the controller 202 may receive control signals from a module 206. The control signals may be formatted according to an industrial automation protocol such Modbus, for example, and may include commands for a field device 208. The controller 202 in some cases may adjust the voltage in view of these commands as well as temperature readings.

Figure 3:
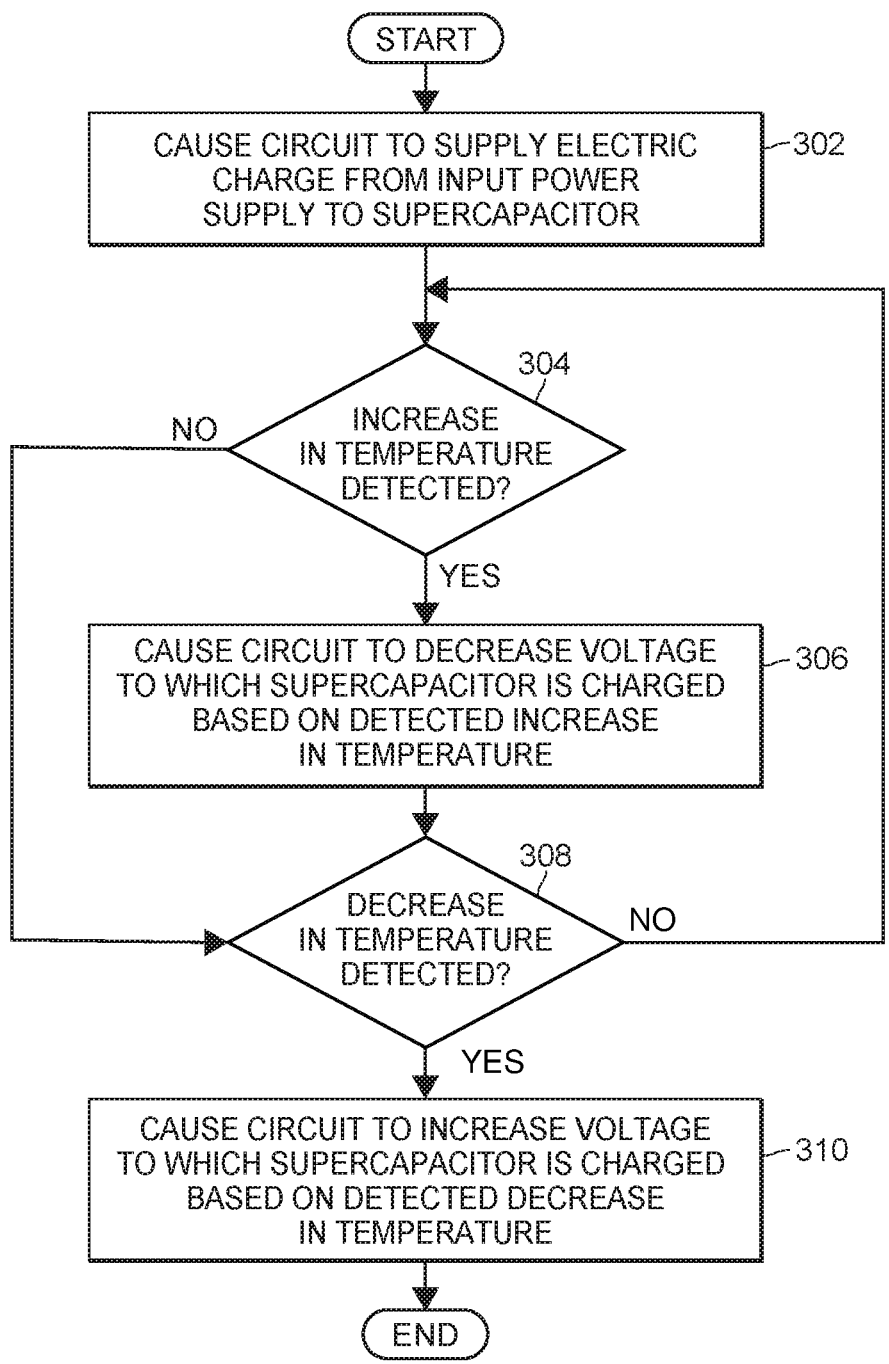
FIG. 3 is a flow diagram of an example method of operating a circuit coupled to an input power supply and a supercapacitor susceptible to damage at high temperatures.

Now referring to FIG. 3, an example method 300 for operating, in a process control system, a circuit (e.g., circuit 100) coupled to an input power supply (e.g., input power supply 102), a supercapacitor susceptible to damage at high temperatures (e.g., supercapacitor 104), and a field device (e.g., field device 106) may be implemented as shown at FIG. 1 or 2. In particular, the method 300 may be implemented as a set of instructions stored on a computer-readable memory and executable on one or more controllers, processors, or other suitable computing systems, configured to control a circuit coupled to an input power supply, a supercapacitor, and a field device (e.g., an actuator).

At block 302, a controller may cause the circuit to supply electric charge from an input power supply to the supercapacitor, e.g., by the controller or other processing hardware. Generally, the circuit may also be caused to supply electric charge from the input power supply to the field device. However, the input power supply may be a variable power supply, such as a solar panel, and may sometimes fail to provide power. Accordingly, the circuit may supply stored electric power from the supercapacitor to the field device when the input power supply fails to provide power to the field device.

At block 304, a query may be made as to whether any increase in the temperature associated with the supercapacitor has been detected, e.g., over a certain period of time. In various embodiments, the query may be made periodically or continuously. In some embodiments, the temperature associated with the supercapacitor may be detected by a temperature sensor. For example, an electric signal indicating the temperature associated with the supercapacitor may be received from a temperature sensor proximate to the supercapacitor. In other embodiments, the temperature associated with the supercapacitor may be inferred automatically, based on one or more operational parameters of the system in which the supercapacitor is implemented (e.g., a system including the supercapacitor, the input power supply, and a field device to which the supercapacitor supplies power).

If an increase in temperature is detected, (block 304, YES), at block 306, the circuit may be caused to decrease the voltage to which the supercapacitor is charged based on the detected increase in temperature, e.g., by the controller or other processing hardware. For example, a target voltage level (e.g., voltage level $V_T$) to which the supercapacitor is to be charged in view of the temperature increase may be determined.

If no increase in temperature is detected, (block 304, NO), at block 308, a query may be made as to whether a decrease in temperature has been detected, e.g., over a certain period of time. In various embodiments, the query may be made periodically or continuously. If a decrease in temperature is detected (block 308, YES), at block 310, the circuit may be caused to increase the voltage to which the supercapacitor is charged based on the detected decrease in temperature, e.g., by the controller or other processing hardware. As in block 304, a target voltage level (e.g., voltage level $V_T$) to which the supercapacitor is to be charged in view of the temperature decrease may be determined.

In some embodiments, the target voltage level $V_T$ may additionally be determined based on a power requirement of the field device coupled to the circuit. For example, an actuator may require a certain amount of power to move a valve into a certain position. Specifically, the valve may need to be moved into a safe position in instances when the input power supply fails to supply power to the actuator. Accordingly, the voltage level $V_T$ may be related to the power required by the actuator to move the valve into the safe position. Additionally or alternatively, the target voltage level $V_T$ may be determined based on the availability of power at the input power supply in some embodiments. For example, when the availability of power at the input power supply decreases, supplying power to the field device may be prioritized over supplying power to the supercapacitor, and, accordingly, the target voltage level $V_T$ of the supercapacitor may be decreased in such instances.

Accordingly, the voltage to which the supercapacitor is charged may be changed from an initial voltage level (e.g., voltage level $V_C$) to the target voltage level $V_T$ based on factors such as an increase or decrease in temperature, power requirement of a field device coupled to the circuit, and/or availability of power at the input power supply. In particular, when a determination is made indicating that the target voltage $V_T$ is lower than the voltage $V_C$, the circuit may be caused to operate a shunt component to remove excess charge from the supercapacitor until the target voltage $V_T$ is reached. On the other hand, when a determination is made indicating that the target voltage $V_T$ is higher than the voltage $V_C$, the circuit may be caused to supply electric charge from the input power supply to charge the supercapacitor to the target voltage $V_T$.

If no decrease in temperature is detected (block 308, NO), the voltage to which the supercapacitor is charged may remain the same (i.e., $V_T = V_C$). Of course, in some embodiments the voltage to which the supercapacitor is charged may additionally vary based on the power requirement of a field device coupled to the circuit, and/or availability of power at the input power supply, as discussed above. A query may again be made as to whether an increase in temperature has been detected (block 304), and the flow may repeat in some instances.

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms. Modules may constitute either software modules (e.g., code stored on a machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the term hardware should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as an SaaS. For example, as indicated above, at least some of the operations may be performed by a group of computers (as examples of machines including processors), these operations being accessible via a network (e.g., the Internet) and via one or more appropriate interfaces (e.g., APIs).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" or a "routine" is a self-consistent sequence of operations or similar processing leading to a desired result. In this context, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for operating a circuit coupled to an input power supply and a supercapacitor susceptible to damage at high temperatures through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method of operating a circuit coupled to an input power supply and a supercapacitor susceptible to damage at high temperatures, the method comprising:
   detecting, by the processing hardware, a temperature associated with the supercapacitor;
   selecting, by the processing hardware, a voltage to which the supercapacitor is to be charged based at least in part on the detected temperature;
   causing, by processing hardware, the circuit to supply electric charge from the input power supply to the supercapacitor based on the selected voltage;
   determining, by the processing hardware, that the supercapacitor is at a voltage level $V_C$;
   determining, by the processing hardware, a target voltage level $V_T$ to which the supercapacitor is to be charged in view of the detected temperature wherein $V_T$ is lower than $V_C$; and
   causing the circuit to operate a shunt component to remove excess charge from the supercapacitor until the target voltage $V_T$ is reached.

2. The method of claim 1, wherein the detected temperature is a first temperature detected at a first time, and wherein the voltage is a first voltage, the method further comprising:
   detecting, by the processing hardware, at a second time, a second temperature of the supercapacitor, wherein the second temperature is higher than the first temperature;
   selecting, by the processing hardware, a second voltage to which the supercapacitor is to be charged based at least in part on the detected second temperature, wherein the second voltage is lower than the first voltage;
   causing, by the processing hardware, the circuit to supply electric charge from the input power supply to the supercapacitor based on the selected second voltage.

3. The method of claim 1, wherein the detected temperature is a first temperature detected at a first time, and wherein the voltage is a first voltage, the method further comprising:
   detecting, by the processing hardware, at a second time, a second temperature of the supercapacitor, wherein the second temperature is lower than the first temperature;
   selecting, by the processing hardware, a second voltage to which the supercapacitor is to be charged based at least in part on the detected second temperature, wherein the second voltage is higher than the first voltage;
   causing, by the processing hardware, the circuit to supply electric charge from the input power supply to the supercapacitor based on the selected second voltage.

4. The method of claim 1, further comprising:
   determining that the target voltage $V_T$ is higher than the voltage $V_C$; and
   causing, by the processing hardware, the circuit to supply electric charge from the input power supply to charge the supercapacitor to the target voltage $V_T$.

5. The method of claim 1, further comprising:
   causing, by the processing hardware, the circuit to supply electric power from the supercapacitor to a field device; and
   determining, by the processing hardware, a power requirement of the field device;
   wherein the determining the target voltage level $V_T$ is further based on a power requirement of the field device.

6. The method of claim 1, wherein the determining the target voltage level $V_T$ is further based on availability of power at the input power supply.

7. The method of claim 1, wherein detecting the temperature of the supercapacitor includes receiving an electric signal indicative of the temperature of the supercapacitor from a temperature sensor.

8. The method of claim 1, wherein detecting the temperature of the supercapacitor includes automatically inferring the temperature based on one or more operational parameters of a system including the supercapacitor, the input power supply, and a field device to which the supercapacitor supplies electric power.

9. A system comprising:
an input power supply;
a supercapacitor;
a field device;
a circuit coupled to the input power supply, the supercapacitor, and the field device;
and a controller configured to:
   select a voltage to which the supercapacitor is to be charged based at least in part on a detected temperature of the supercapacitor;
   cause the circuit to supply electric charge from the input power supply to the supercapacitor based on the selected voltage;
   determine that the supercapacitor is at a voltage level $V_C$;
   determine a target voltage level $V_T$ to which the supercapacitor is to be charged in view of the detected temperature wherein $V_T$ is lower than $V_C$; and
   cause the circuit to operate a shunt component to remove excess charge from the supercapacitor until the target voltage $V_T$ is reached.

10. The system of claim 9, wherein the detected temperature is a first temperature detected at a first time, and wherein the voltage is a first voltage, wherein the controller is further configured to:
   select a second voltage to which the supercapacitor is to be charged based at least in part on a second temperature of the supercapacitor detected at a second time, wherein the second temperature is higher than the first temperature, and wherein the second voltage is lower than the first voltage;
   cause the circuit to supply electric charge from the input power supply to the supercapacitor based on the selected second voltage.

11. The system of claim 9, wherein the detected temperature is a first temperature detected at a first time, and wherein the voltage is a first voltage, wherein the controller is further configured to:
   select a second voltage to which the supercapacitor is to be charged based at least in part on a second temperature of the supercapacitor detected at a second time, wherein the second temperature is lower than the first temperature, and wherein the second voltage is higher than the first voltage;
   cause the circuit to supply electric charge from the input power supply to the supercapacitor based on the selected second voltage.

12. The system of claim 9, further comprising a temperature sensor configured to detect the temperature associated with the supercapacitor.

13. The system of claim 12, wherein the temperature sensor is positioned within the controller.

14. The system of claim 12, wherein the temperature sensor is positioned outside of the controller.

15. The system of claim 10, wherein the controller is configured to infer the increase in the temperature based on one or more operational parameters of a system including the supercapacitor, the input power supply, and a field device to which the supercapacitor supplies electric power.

16. The system of claim 8, wherein the controller is further configured to cause the circuit to supply electric power from the supercapacitor to a field device.

17. The system of claim 16, wherein the controller is further configured to cause the circuit to supply electric power from the supercapacitor to a field device based on a failure of the input power supply.

18. The system of claim 9, wherein the field device is an actuator.

19. The system of claim 9, wherein the input power supply is a variable power supply.

20. The system of claim 9, wherein the input power supply is a solar power supply.

21. A method of operating a circuit coupled to an input power supply and a supercapacitor susceptible to damage at high temperatures, the method comprising:
detecting, by the processing hardware, a temperature associated with the supercapacitor;
selecting, by the processing hardware, a voltage to which the supercapacitor is to be charged based at least in part on the detected temperature;
causing, by processing hardware, the circuit to supply electric charge from the input power supply to the supercapacitor based on the selected voltage;
causing, by the processing hardware, the circuit to supply electric power from the supercapacitor to a field device;
determining, by the processing hardware, a power requirement of the field device;
determining, by the processing hardware, that the supercapacitor is at a voltage level $V_C$;
determining, by the processing hardware, a target voltage level $V_T$ to which the supercapacitor is to be charged based on the detected temperature and based on a power requirement of the field device.

22. A method of operating a circuit coupled to an input power supply and a supercapacitor susceptible to damage at high temperatures, the method comprising:
detecting, by the processing hardware, a temperature associated with the supercapacitor;
selecting, by the processing hardware, a voltage to which the supercapacitor is to be charged based at least in part on the detected temperature;
causing, by processing hardware, the circuit to supply electric charge from the input power supply to the supercapacitor based on the selected voltage
determining, by the processing hardware, that the supercapacitor is at a voltage level $V_C$; and
determining, by the processing hardware, a target voltage level $V_T$ to which the supercapacitor is to be charged based on the detected temperature and based on an availability of power at the input power supply.

23. A system comprising:
an input power supply;
a supercapacitor;
a field device;
a circuit coupled to the input power supply, the supercapacitor, and the field device;
and a controller configured to:
   select a voltage to which the supercapacitor is to be charged based at least in part on a detected temperature of the supercapacitor;

cause the circuit to supply electric charge from the input power supply to the supercapacitor based on the selected voltage;

cause the circuit to supply electric power from the supercapacitor to the field device;

determine a power requirement of the field device;

determine that the supercapacitor is at a voltage level $V_C$; and determine a target voltage level $V_T$ to which the supercapacitor is to be charged based on the detected temperature and based on a power requirement of the field device.

24. A system comprising:

an input power supply;

a supercapacitor;

a field device;

a circuit coupled to the input power supply, the supercapacitor, and the field device;

and a controller configured to:

select a voltage to which the supercapacitor is to be charged based at least in part on a detected temperature of the supercapacitor;

cause the circuit to supply electric charge from the input power supply to the supercapacitor based on the selected voltage;

determine that the supercapacitor is at a voltage level $V_C$; and determine a target voltage level $V_T$ to which the supercapacitor is to be charged based on the detected temperature and based on an availability of power at the input power supply.

* * * * *

UNITED STATES PATENT AND TRADEMARK OFFICE
CERTIFICATE OF CORRECTION

PATENT NO. : 10,749,373 B2  
APPLICATION NO. : 16/136917  
DATED : August 18, 2020  
INVENTOR(S) : Stephen G. Seberger et al.

Page 1 of 1

It is certified that error appears in the above-identified patent and that said Letters Patent is hereby corrected as shown below:

In the Specification

At Column 4, Line 10, "minutes.)" should be -- minutes). --.

At Column 5, Line 34, "such" should be -- such as --.

In the Claims

At Column 10, Line 22, "temperature" should be -- temperature, --.

At Column 12, Line 6, "claim 8," should be -- claim 9, --.

At Column 12, Line 51, "voltage" should be -- voltage; --.

Signed and Sealed this  
Twenty-ninth Day of April, 2025

Coke Morgan Stewart  
*Acting Director of the United States Patent and Trademark Office*